United States Patent [19]

Komazaki

[11] Patent Number: 5,065,403
[45] Date of Patent: Nov. 12, 1991

[54] SELF-ALIGNMENT TYPE WINDOW SEMICONDUCTOR LASER

[75] Inventor: Iwao Komazaki, Tokyo, Japan
[73] Assignee: Nec Corporation, Tokyo, Japan
[21] Appl. No.: 537,955
[22] Filed: Jun. 13, 1990
[30] Foreign Application Priority Data Jun. 13, 1989 [JP]  Japan .................................. 1-151650

[51] Int. Cl.$^5$ .............................................. H01S 3/19
[52] U.S. Cl. ........................................ 372/46; 372/45
[58] Field of Search ............................. 372/46, 45, 43

[56] References Cited

U.S. PATENT DOCUMENTS

| 4,121,179 | 10/1978 | Chinone et al. | 372/46 |
| 4,916,709 | 4/1990 | Ota et al. | 372/46 |

FOREIGN PATENT DOCUMENTS 0112785  9/1981  Japan ..................................... 372/46

Primary Examiner—Georgia Epps
Attorney, Agent, or Firm—Sughrue, Mion, Zinn, Macpeak & Seas

[57] ABSTRACT

Current blocking layers are provided on whole both side surfaces of a mesa stripe structure to control a transverse mode of light in active and window sections. In a longitudinal direction of a laser cavity, an active layer and optical guiding layers are coupled by taper like optical waveguides. As a result, a low loss coupling and a high optical radiation power are obtained in a self-alignment type window semiconductor laser according to the invention. Further, a wafer surface is flatted, after the regrowth of the window sections, so that the window sections and an active section are simultaneously processed in regard to an optical transverse mode. As a result, a fabricating process is simplified in the invention.

3 Claims, 4 Drawing Sheets

SELF-ALIGNMENT TYPE WINDOW SEMICONDUCTOR LASER

FIELD OF THE INVENTION

This invention relates to a self-alignment type window semiconductor laser and a method for fabricating the same, and more particularly to, a self-alignment type window semiconductor laser which is applied to an information processing system, a communication system between satellites, a light source for an optical measuring instrument, etc. and a method for fabricating the same.

BACKGROUND OF THE INVENTION

In a semiconductor laser, it is important to decrease light absorption in an active layer in the vicinity of mirrors, thereby suppressing local heating in the areas, so that a light output of the semiconductor laser becomes high. For this purpose, an active layer is removed at the vicinity of facets for emitting light to provide windows which are transparent at a lasing wavelength, so that the optical absorption is avoided at the facets.

One type of the windows are explained in a report entitled "Large optical cavity AlGaAs buried heterostructure window lasers" by H. Blauvelt, et al which is described on pages 1029 to 1031 in "Appl. Phys. Lett. 40 (12), 15 June 1982", wherein the windows are provided in a structure to be buried the facets of active section by a crystal having a mixed crystal ratio of Al larger than that of an active layer.

This type of a semiconductor laser will be fabricated as follows.

At first, an n-$Al_xGa_{1-x}As$ cladding layer, and an active layer are successively grown on an n-GaAs substrate ≠ by liquid phase epitary, and the cladding layer and the active layer are partially removed in wet etching at both ends by 25 μm. The etched sections are buried with p-$Al_zGa_{1-z}As$ layers and n-$Al_zGa_{1-z}As$ layers each having a mixed crystal ratio of Al smaller than that of the cladding layer and larger than an optical guiding layer (to be grown next) to provide high resistive optical window section. The optical guiding layer of p-$Al_yGa_{1-y}As$, a cladding layer of p-$Al_{x'}Ga_{1-x'}As$, and an n-GaAs layer are then grown on the active layer and the optical window section. Thereafter, Zn is selectively diffused into the n-GaAs layer and an upper portion of the cladding layer.

Then, an insulation film is formed on the n-GaAs layer in the vicinity of the facets to be cleaved in the center section thereof, and n- and p- electrodes are provided on the bottom surface of the n-GaAs substrate and the upper surface of the n-GaAs layer, respectively, to complete the window semiconductor laser.

In this window semiconductor laser, a maximum gain wavelength (light emitting wavelength) is obtained as a result of re-combination of carriers injected in a large amount into the center section, while no absorption of light occurs in the window section in the vicinity of the facets having a bandgap energy larger than the center section, so that the optical radiation power is increased. In fact, a catastrophic optical damage power level is increased from several tens mW to 150 mW by the provision of the window regions.

However, this window semiconductor laser has disadvantages in that light propagating through the optical guiding layer reflects and scatters at coupling portions between the window regions including the p- and n-$Al_zGa_{1-z}As$ layers and the active layer to result in the increase of coupling losses and a threshold current, the decrease of an efficiency, and the occurence of thermal saturation, so that a high optical radiation power is difficult to be obtained, when the p- and n-$Al_zGa_{1-z}As$ layers do not coincide in thickness with the active layer. For the purpose of overcoming these disadvantages, the p- and n-$Al_zGa_{1-z}As$ layers are necessary to be controlled in thickness. However, this thickness control is difficult, although the structure of this window semiconductor laser is well adapted to liquid phase epitaxy, wherein a speed of growing $Al_zGa_{1-z}As$ on $Al_zGa_{1-z}As$ is much lower than that of growing $Al_zGa_{1-z}As$ on GaAs. For these reasons, this window semiconductor laser is difficult to be fabricated by use of this growth technology.

This window semiconductor laser has a further disadvantage in that a focused beam diameter of an emitted light is difficult to be an order of microns due to the fact that light which is controlled in mode in the active layer is expanded transversely in the window sections, because the window sections do not have a function of controlling a transverse mode. For a light source in an information processing system, especially, it is very important that a light beam is well controlled in a horizontal, transverse mode to increase reliability of the system and an effective availability of the light beam. A structure of controlling a horizontal, transverse mode can be added to this window semiconductor laser. As a result, however, the fabrication process thereof becomes very complicated.

SUMMARY OF THE INVENTION

Accordingly, it is an object of this invention to provide a self-alignment type window semiconductor layer in which an active section and window sections are smoothly coupled.

It is a further object of this invention to provide a self-alignment type window semiconductor laser in which light well controlled in a horizontal, transverse mode is obtained.

It is a still further object of this invention to provide a self-alignment type window semiconductor laser in which a high optical rediation power is obtained.

It is a yet still further object of this invention to provide a method for fabricating a self-alignment type window semiconductor laser in which MOVPE technology is utilized to provide well-controllable and mass-productable properties.

According to a feature of this invention, a self-alignment type window semiconductor laser, comprises:

an active layer provided on a semiconductor substrate;

a cladding layer provided on the active layer, the cladding layer including a mesa stripe structure;

current blocking layers, by which the mesa stripe structure being buried the facets thereof;

window structures having no optical absorption to be provided in vicinities of the facets, the window structures being of a semiconductor layer having a bandgap energy larger than the active layer; and p- and n- electrodes for applying a predetermined voltage across the active layer;

wherein the mesa stripe structure is buried in the vicinities by the current blocking layers.

According to another feature of this invention, a method for fabricating a self-alignment type window semiconductor laser, comprising steps of:

growing an active layer on a semiconductor substrate;

growing a cladding layer on the active layer;

removing the active layer and the cladding layer except for a portion corresponding to an active region;

growing first semiconductor layers of a bandgap energy larger than the active layer to provide window structures, removed portions of the active and cladding layers being buried with the window structures;

flatting a top surface of a composite structure including the active and cladding layers which are buried by the window structures;

providing a mesa stripe structure in the composite structure;

growing second semiconductor layers on both sides of the mesa stripe structure, the second semiconductor layers being current blocking layers; and providing p- and n- electrodes for applying a predetermined voltage across the active layer.

BRIEF DESCRIPTION OF THE DRAWINGS

This invention will be explained in more detail in conjunction with appended drawings, wherein.

DESCRIPTION OF THE PREFERRED EMBODIMENT

Figure 1:
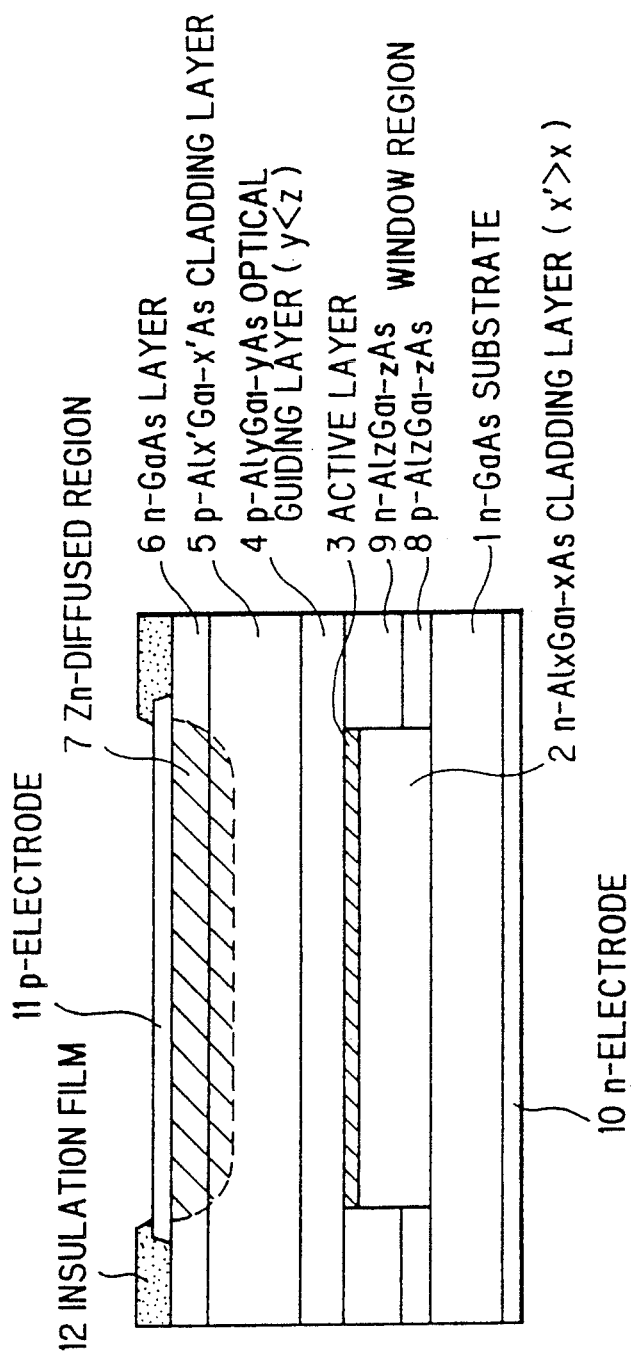
FIG. 1 is a schematic view showing a conventional window semiconductor laser.

Before explaining a self-alignment type window semiconductor laser in the preferred embodiment according to the invention, the aforementioned conventional window semiconductor laser will be again explained in following fabricating steps in conjunction with FIG. 1.

At first, an n-$Al_xGa_{1-x}As$ cladding layer 2, and an active layer 3 are successively grown on an n-GaAs substrate 1 by liquid phase epitaxy, and the cladding layer 2 and the active layer 3 are removed in wet etching at both ends by 25 μm. The etched portions are buried with p-$Al_zGa_{1-z}As$ layers 8 and n-$Al_zGa_{1-z}As$ layers 9 each having a mixed crystal ratio of Al smaller than that of the cladding layer 2 and larger than an optical guiding layer 4 (to be grown next) to provide high resistive optical window regions. The optical guiding layer 4 of p-$Al_yGa_{1-y}As$, a cladding layer 5 of p-$Al_xGa_{1-x}As$, and an n-GaAs layer 6 are then grown on the active layer 3 and the optical window regions. Thereafter, Zn is selectively diffused into the n-GaAs layer 6 and an upper portion of the cladding layer 5. Then, an insulation film 12 is formed on the n-GaAs layer 6 in the vicinity of the facets to be cleaved in the central portion thereof, and n- and p- electrodes 10 and 11 are provided on the bottom surface of the n-GaAs substrate 1 and the upper surface of the n-GaAs layer 6, respectively, to complete the window semiconductor laser.

Figure 2:
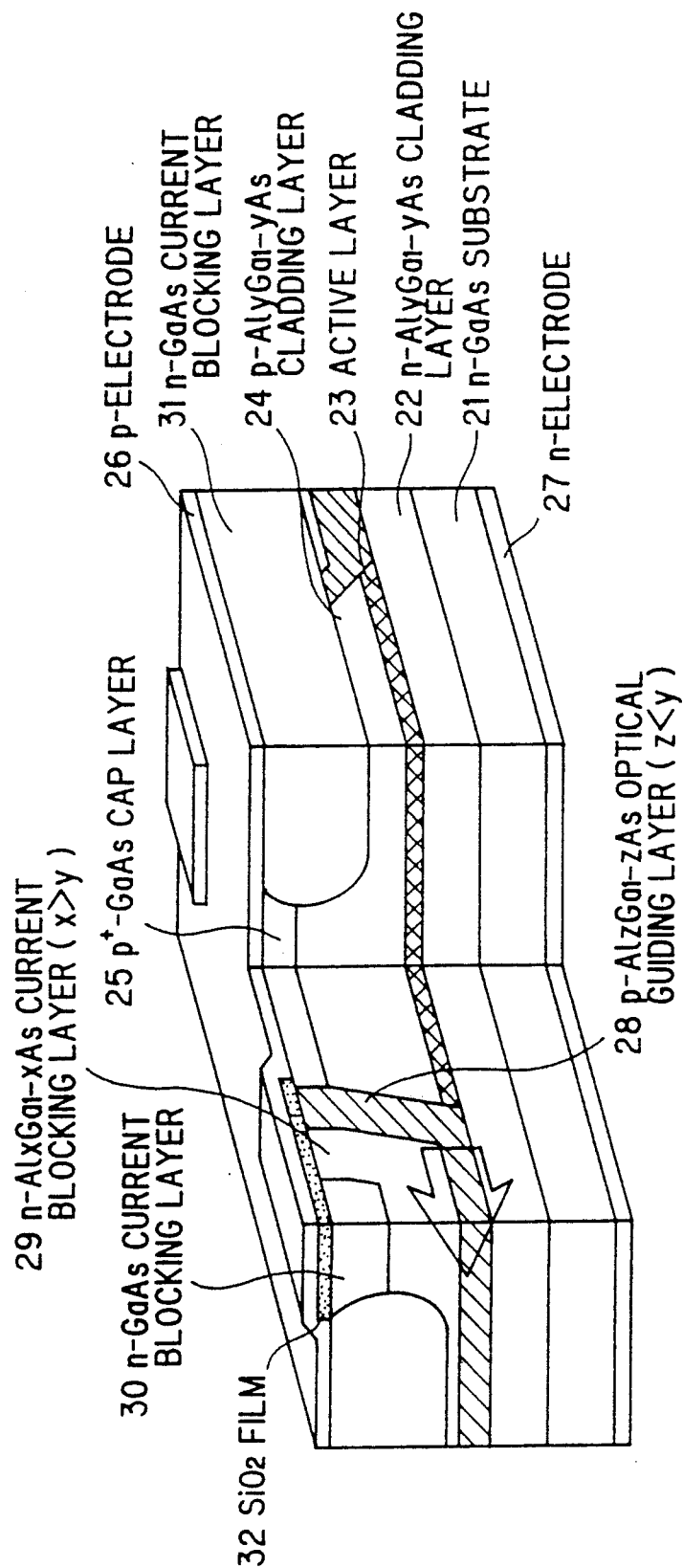
FIG. 2 is a schematic view showing a self-alignment type window semiconductor laser in a preferred embodiment according to the invention.

Next, a self-alignment type window semiconductor laser in the preferred embodiment is shown in FIG. 2, wherein it comprises an n-GaAs substrate 21, an n-$Al_yGa_{1-y}As$ cladding layer 22, an active layer 23, a p-$Al_yGa_{1-y}As$ cladding layer 24, a $p^+$-GaAs cap layer 25, p- and n- electrodes 26 and 27, p-$Al_zGa_{1-z}As$ optical guiding layers 28, n-$Al_xGa_{1-x}As$ current blocking layers 29, n-GaAs current blocking layers 30 and 31, and a $SiO_2$ film 32.

Next, a method for fabricating a self-alignment type window semiconductor laser in the preferred embodiment according to the invention will be explained in conjunction with FIGS. 3A to 3F.

Figure 3A:
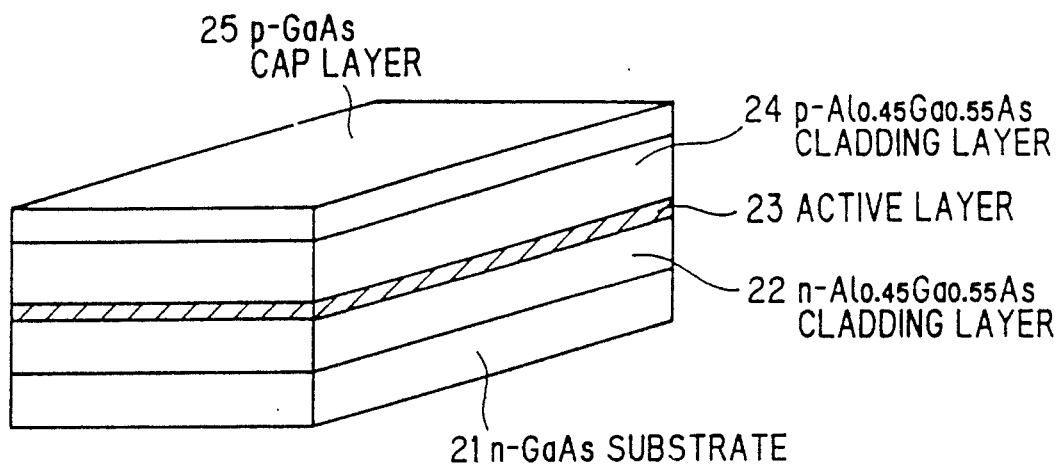
FIGS. 3A to 3F are schematic views showing steps in a method for fabricating a self-alignment type window semiconductor laser in a preferred embodiment according to the invention.

In FIG. 3A, an n-$Al_{0.45}Ga_{0.55}As$ cladding layer 22 doped with Si and having an impurity concentration of $2 \times 10^{17}$ $cm^{-3}$ and a thickness of 2 μm, a non-doped $Al_{0.15}Ga_{0.85}As$ active layer 23 having a thickness of 400 Å, a p-$Al_{0.45}Ga_{0.55}As$ cladding layer 24 doped with Mg and having an impurity concentration of $1 \times 10^{18}$ $cm^{-3}$ and thickness of 2 μm, and a $p^+$-GaAs cap layer 25 doped with Mg and having an impurity concentration of $5 \times 10^{18}$ $cm^{-3}$ and a thickness of 1 μm are successively grown on an n-GaAs<001> substrate 21 doped with Si and an impurity concentration of $2 \times 10^{18}$ $cm^{-3}$ by MOVPE technology.

Figure 3B:
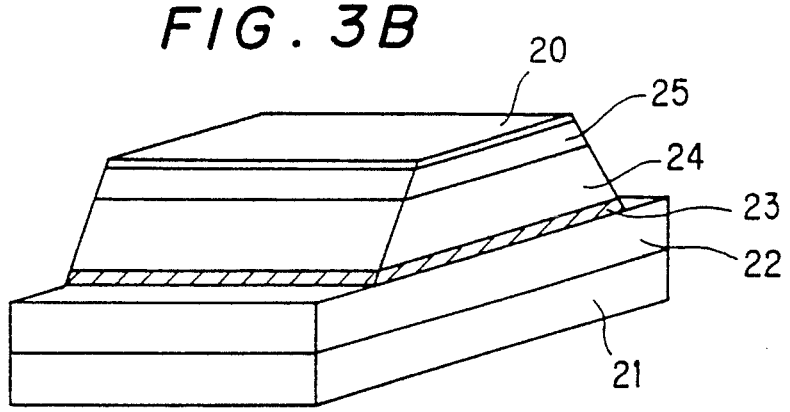

In FIG. 3B, a resist having an area corresponding to an active region is provided on the cap layer 25, and the active layer 23, the cladding layer 24 and the cap layer 25 of window sections having a length of 50 μm (25 μm on a device) and an interval of 300 μm in a forward mesa direction are removed to expose an epitaxial crystal surface by use of phosphoric acid system etchant ($3CH_3OH + H_2O_2 + H_3PO_4$) of 20° C.

Figure 3C:
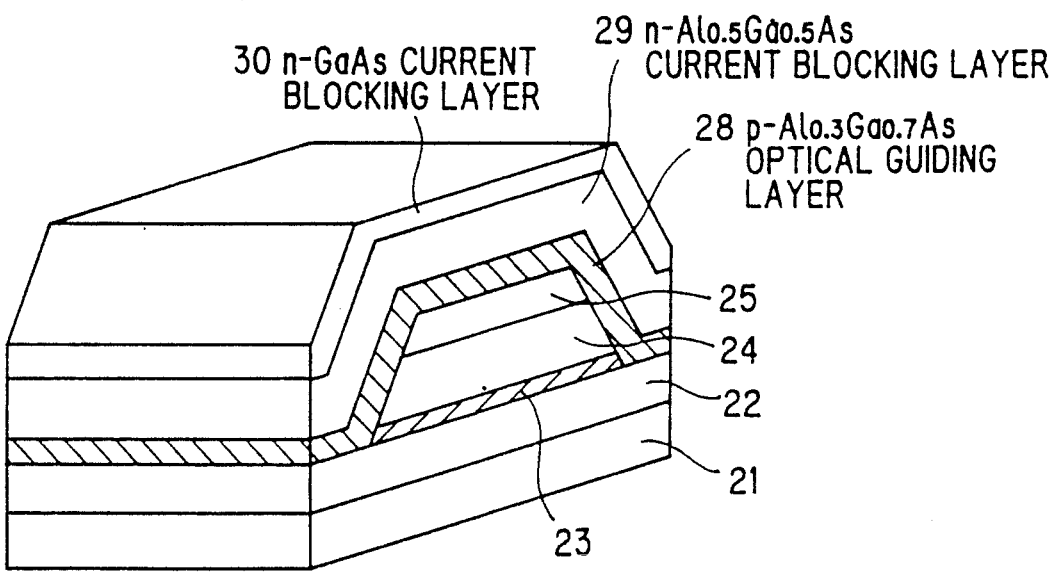

In FIG. 3C, the resist 20 is removed from the top surface of the cap layer 25, and a p-$Al_{0.3}Ga_{0.7}As$ optical guiding layer 28 doped with Mg and having an impurity concentration of $5 \times 10^{17}$ $cm^{-3}$ and a thickness of 0.2 μm, an n-$Al_{0.5}Ga_{0.5}As$ current blocking layer 29 doped with Si and having an impurity concentration of $1 \times 10^{17}$ $cm^{-3}$ and a thickness of 2.0 μm, and an n-GaAs current blocking layer 30 doped with Si and having an impurity concentration of $2 \times 10^{18}$ $cm^{-3}$ and a thickness of 0.8 μm are successively grown on the active section which is to be buried.

Figure 3D:
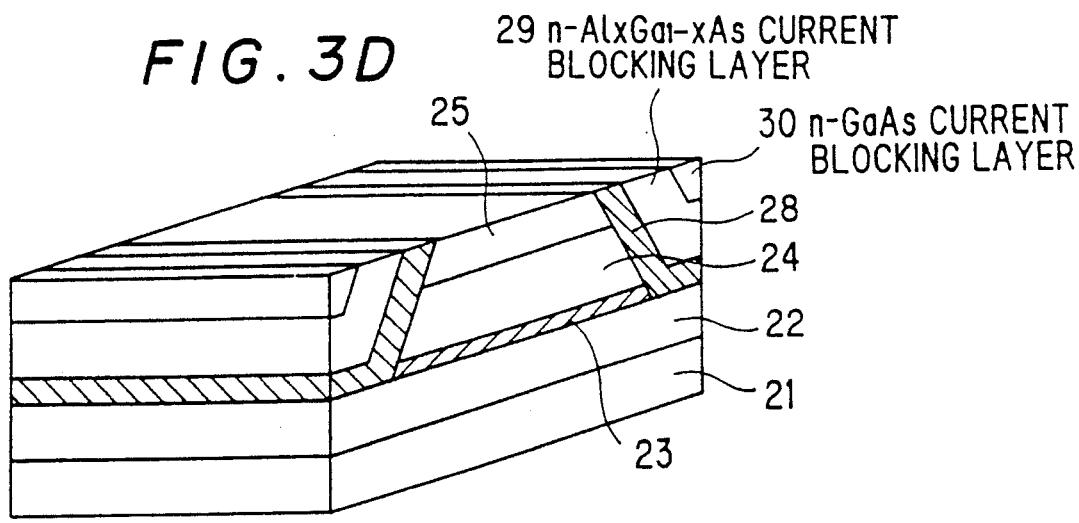

In FIG. 3D, the window sections are covered by resists (not shown), so that the active section is removed to expose the cap layer 25 by use of the phosphoric acid system etchant. As a result, the window sections and the active section become flat on the top surface thereof.

Figure 3E:
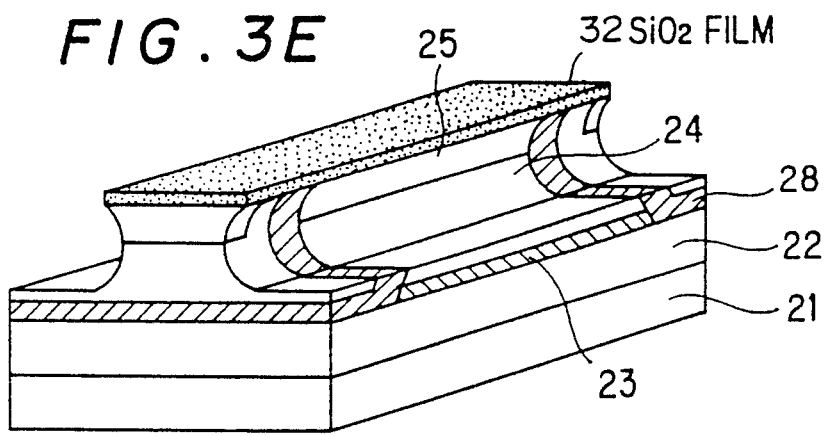

In FIG. 3E, a $SiO_2$ film 32 having a thickness of 4000 Å is formed on the cap layer 25, and a stripe pattern of the $SiO_2$ film 32 having a width of 6 μm is provided in a <011> (reverse mesa) direction by photolithography technology. Then, the cladding layer 24 and the cap layer 25 are etched on both sides of a mesa stripe to provide a non-etched p-cladding layer 24 having a thickness of 0.3 to 0.4 μm by use of the phosphoric acid system etchant.

Figure 3F:
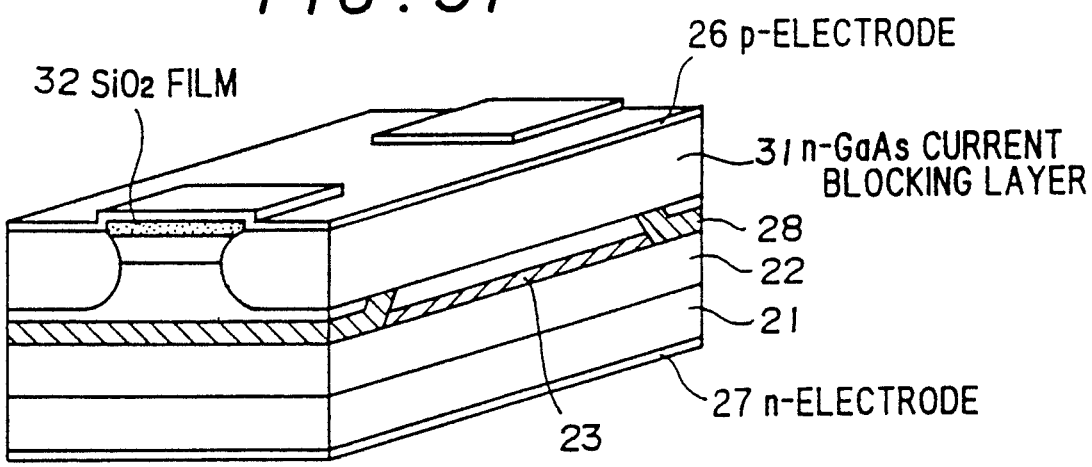

In FIG. 3F, a re-growth process is carried out in a condition that the $SiO_2$ film 32 remains provided on the mesa stripe, so that n-GaAs current blocking layers 31 doped with Si and having an impurity concentration of $3 \times 10^{18}$ $cm^{-3}$ is selectively grown to bury the both sides of the mesa stripe.

Finally, the $SiO_2$ stripe film is partially removed on the active section, and a p-electrode 26 and an n-electrode 27 are provided on the top surface of the mesa strip and the n-GaAs current blocking layer 31 and the back surface of the n-GaAs substrate 21. Then, the window sections are cleaved in the center section thereof. Consequently, the self-alignment type window semiconductor laser having the window sections of 25 μm length, the active section of 300 μm length and total resonator length of 350 μm is obtained as shown in FIG. 2.

In this preferred embodiment, a selective growth of AlGaAs system is possible to be carried out in the step of FIG. 3D, if a MOVPE furnace of a super-decreased pressure less than 10 torr is utilized. As a result, the step of FIG. 3C can be omitted to simplify the process.

In operation, carriers injected from the p-electrode 26 are almost injected into the active section, because the window sections are covered by the $SiO_2$ stripe films 32. At coupling portions, recombination of the carriers is negligible, because these portions have bandgap energies larger than the active layer 23, although leak current flows from the p-$Al_yGa_{(1-y)}As$ optical guiding layers 28. In other words, the window sections are non-current injecting sections, in which no decrease of a refractive index is observed, although it occurs usually due to plasma effect resulted from carrier injection. In the active section, the carriers are re-combined to generate light which is smoothly coupled to the optical guiding layers 28 with a low coupling loss, because the active section is coupled to the window sections by taper like optical waveguides, so that the light is repeatedly fedback at the facets to provide an amplified oscillation.

In regard to a horizontal, transverse control of light beam, the n-GaAs current blocking layers 31 provided on the both sides of the mesa stripe do not only suppress carrier injections, but also absorb light distribution leaked in a transverse direction to avoid transverse expansion of light. As a result, the transverse control of the light beam is completely carried out.

In this invention, an advantage is obtained in that the active layer 23 and the p-$Al_zGa_{1-z}As$ optical guiding layers 28 are coupled by taper like optical waveguides, even if a resonator is provided in any direction of forward and reverse direction.

In fact, it is expected that a high optical radiation power greater than 300 mW is obtained in CW operation of this invention.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A self-alignment type window semiconductor laser, comprising:
    an active layer provided on a semiconductor substrate;
    a cladding layer provided on said active layer, said cladding layer including a mesa stripe structure;
    current blocking layers, by which said mesa stripe structure is buried on both sides thereof;
    window structures having no laser light absorption to be provided in vicinities of facets of the current blocking layer, said window structures being of a semiconductor layer having a bandgap energy larger than said active layer; and
    p- and n- electrodes for applying a predetermined voltage across said active layer;
    wherein said mesa stripe structure is buried in said vicinities of said facets of said current blocking layers.

2. A self-alignment type window semiconductor laser, according to claim 1, further comprising:
    taper like optical guiding layers each being in contact with said active layer and said cladding layer at a corresponding end thereof.

3. A self-alignment type window semiconductor laser, according to claim 1, further comprising;
    insulation films provided on said mesa stripe structure on the current blocking layer except for on an active section.

* * * * *